United States Patent
Lipson et al.

(10) Patent No.: US 9,389,413 B2
(45) Date of Patent: Jul. 12, 2016

(54) OPTOMECHANICAL OSCILLATOR NETWORK, CONTROL AND SYNCHRONIZATION METHODS, AND APPLICATIONS

(75) Inventors: Michal Lipson, Ithaca, NY (US); Paul McEuen, Newfield, NY (US); Arthur Barnard, Delmar, NY (US); Sasikanth Manipatruni, Hillsboro, OR (US); Mian Zhang, Ithaca, NY (US); Gustavo Wiederhecker, Campinas São Paulo (BR)

(73) Assignee: CORNELL UNIVERSITY, Ithaca, NY (US)

(*) Notice: Subject to any disclaimer, the term of this patent is extended or adjusted under 35 U.S.C. 154(b) by 143 days.

(21) Appl. No.: 14/130,967

(22) PCT Filed: Jul. 6, 2012

(86) PCT No.: PCT/US2012/045708
§ 371 (c)(1),
(2), (4) Date: Jul. 11, 2014

(87) PCT Pub. No.: WO2013/006773
PCT Pub. Date: Jan. 10, 2013

(65) Prior Publication Data
US 2014/0313559 A1    Oct. 23, 2014

Related U.S. Application Data

(60) Provisional application No. 61/504,761, filed on Jul. 6, 2011, provisional application No. 61/577,351, filed on Dec. 19, 2011.

(51) Int. Cl.
*G02B 26/00*   (2006.01)
*G02B 6/26*    (2006.01)
(Continued)

(52) U.S. Cl.
CPC ............ *G02B 26/002* (2013.01); *G02B 6/26* (2013.01); *G02B 6/29338* (2013.01);
(Continued)

(58) Field of Classification Search
CPC .... G02B 26/00; G02B 26/001; G02B 26/002; G02B 6/26; G02B 6/29338; G02B 6/29341; H01S 3/105; H01S 3/1305; H01S 3/137; H01S 5/0687; H01S 5/1075; G06F 1/011; G06F 2203/15; H03L 7/00; B82Y 10/00; B81B 3/0018; H03H 3/0072; H03H 9/2431
USPC .......... 359/237–239, 245; 385/14, 16, 18, 26, 385/27, 30, 32, 129; 372/18, 20, 21, 26, 27, 372/28, 32, 69; 331/116 R, 154, 156; 333/186, 187, 197; 73/504.16, 514.26
See application file for complete search history.

(56) References Cited

U.S. PATENT DOCUMENTS 6,298,723 B1 * 10/2001 Konno ............... G01C 19/5607
                                                73/504.16

(Continued)

FOREIGN PATENT DOCUMENTS

| JP | 04358837 A | 8/2009 |
|---|---|---|
| WO | 2009064935 A2 | 5/2009 |
| WO | 2011143407 A2 | 11/2011 |

OTHER PUBLICATIONS

Vicente, R., et al., "Nonlinear Dynamics and Synchronization of Bidirectionally Coupled Semiconductor Lasers", Universitat De Les Illes Balears, Jun. 2006, pp. 1-207.

(Continued)

*Primary Examiner* — Loha Ben
(74) *Attorney, Agent, or Firm* — William Greener; Bond Schoeneck & King, PLLC

(57) ABSTRACT

A synchronizable optomechanical oscillator (OMO) network including at least two dissimilar silicon nitride ($Si_3N_4$) optomechanical resonators that can be excited to evolve into self-sustaining optomechanical oscillators (OMOs) coupled only through an optical radiation field. The tunability of the optical coupling between the oscillators enables one to externally control the dynamics and switch between coupled and individual oscillation states.

12 Claims, 3 Drawing Sheets

Figure 1:
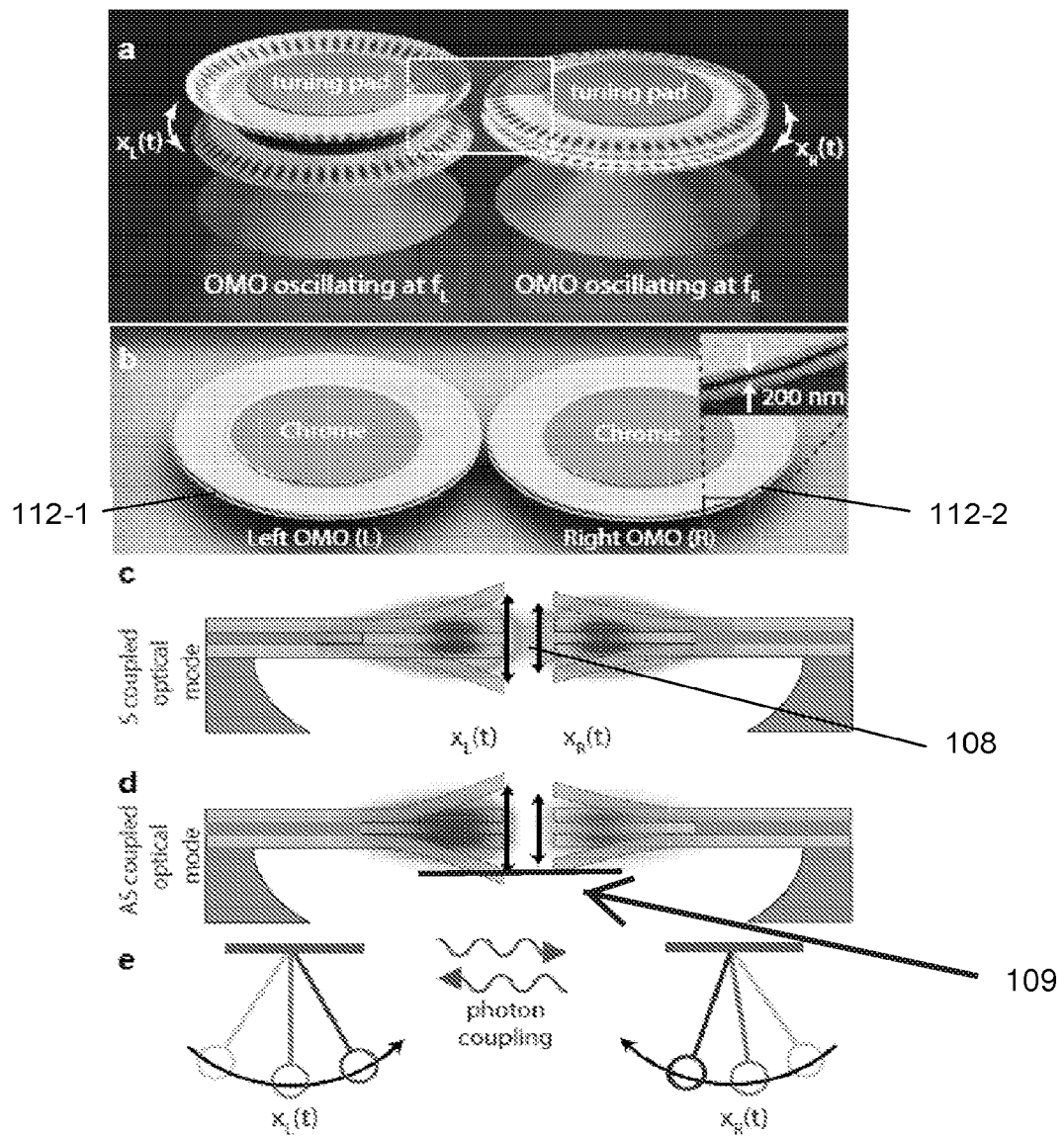

(51) Int. Cl.
| | |
|---|---|
| *H01S 3/10* | (2006.01) |
| *H03L 7/00* | (2006.01) |
| *H03H 3/007* | (2006.01) |
| *G02B 6/293* | (2006.01) |
| *H01S 3/105* | (2006.01) |
| *G02F 1/01* | (2006.01) |
| *B82Y 10/00* | (2011.01) |
| *B81B 3/00* | (2006.01) |
| *H03H 9/24* | (2006.01) |

(52) U.S. Cl.
CPC .......... *G02B 26/001* (2013.01); *H03H 3/0072* (2013.01); *H03L 7/00* (2013.01); *B81B 3/0018* (2013.01); *B82Y 10/00* (2013.01); *G02F 1/011* (2013.01); *G02F 2203/15* (2013.01); *H01S 3/105* (2013.01); *H03H 9/2447* (2013.01)

(56) References Cited

U.S. PATENT DOCUMENTS

| | | | |
|---|---|---|---|
| 6,633,696 B1 * | 10/2003 | Vahala | B82Y 20/00 385/1 |
| 6,803,840 B2 * | 10/2004 | Hunt | B82Y 10/00 205/766 |
| 6,865,317 B2 | 3/2005 | Vahala et al. | |
| 6,891,996 B2 | 5/2005 | Sercel et al. | |
| 6,891,997 B2 | 5/2005 | Sercel et al. | |
| 6,944,369 B2 | 9/2005 | Deliwala | |
| 6,987,914 B2 | 1/2006 | Savchenkov et al. | |
| 7,024,069 B2 | 4/2006 | Savchenkov et al. | |
| 7,092,590 B2 | 8/2006 | Lim et al. | |
| 7,187,827 B2 | 3/2007 | Montgomery et al. | |
| 7,236,679 B2 | 6/2007 | Montgomery et al. | |
| 7,286,734 B2 | 10/2007 | Montgomery et al. | |
| 7,346,241 B2 | 3/2008 | Montgomery et al. | |
| 7,369,003 B2 | 5/2008 | Hageli | |
| 7,389,025 B2 | 6/2008 | Smith et al. | |
| 7,389,053 B1 * | 6/2008 | Ilchenko | G02B 6/12007 372/28 |
| 7,460,746 B2 | 12/2008 | Maleki et al. | |
| 7,532,790 B2 | 5/2009 | Smith et al. | |
| 7,634,201 B2 | 12/2009 | Maleki et al. | |
| 7,781,217 B2 * | 8/2010 | Armani | G01N 21/7746 436/57 |
| 7,961,988 B2 | 6/2011 | Krug et al. | |
| 8,035,255 B2 | 10/2011 | Kurs et al. | |
| 8,049,580 B2 | 11/2011 | Reichenbach et al. | |
| 8,068,706 B2 | 11/2011 | Popovic et al. | |
| 8,120,448 B2 * | 2/2012 | Peng | B82Y 10/00 331/154 |
| 8,124,927 B2 | 2/2012 | Savchenkov et al. | |
| 8,804,231 B2 * | 8/2014 | Savchenkov | H01S 5/0687 359/337.1 |
| 2008/0075464 A1 | 3/2008 | Maleki et al. | |
| 2008/0285606 A1 | 11/2008 | Kippenberg et al. | |
| 2009/0263137 A1 | 10/2009 | Hossein-Zadeh et al. | |
| 2010/0141042 A1 | 6/2010 | Kesler et al. | |
| 2010/0148589 A1 | 6/2010 | Hamam et al. | |
| 2010/0259110 A1 | 10/2010 | Kurs et al. | |
| 2011/0043049 A1 | 2/2011 | Karalis et al. | |
| 2011/0103733 A1 | 5/2011 | Tang et al. | |
| 2012/0139647 A1 | 6/2012 | Schoepf et al. | |
| 2014/0260614 A1 * | 9/2014 | Bhave | G01C 19/04 73/514.26 |

OTHER PUBLICATIONS

Lindley, Brandon S. and Schwartz, Ira B., Modeling Synchronization in Networks of Delay-Coupled Fiber Ring Lasers, U.S. Naval Research Laboratory, Code6792, Plasma Physics Division, Nonlinear Systems Dynamics Section, Washington, D.C. 20375, USA, Optics Express, Nov. 21, 2011, vol. 19, No. 24, pp. 24460-24467.
Commissioner; International Search Report and Written Opinion; KIPO; Jan. 21, 2013.

\* cited by examiner

OPTOMECHANICAL OSCILLATOR NETWORK, CONTROL AND SYNCHRONIZATION METHODS, AND APPLICATIONS

RELATED APPLICATION DATA

The instant application claims priority to U.S. provisional patent application Ser. No. 61/504,761 filed on Jul. 6, 2011 and to U.S. provisional patent application Ser. No. 61/577,351 filed on Dec. 19, 2011, the subject matter of which are herein incorporated by reference in their entireties.

Embodiments of the invention are in the field of synchronized systems and networks, synchronization processes, and associated application. More particularly, embodiments of the invention are directed to controllable and synchronizable optomechanical systems and networks, associated control and synchronization methods, and applications thereof.

Synchronization, the emergence of spontaneous order in coupled systems, is of fundamental importance in both physical and biological systems. Synchronization processes are part of our daily experiences as they occur widely in nature, for example in firefly colonies, pacemaker cells in the heart, nervous systems, and circadian cycles. Synchronization is also of significant technological interest since it provides the basis for timing and navigation, signal processing, microwave communication, and could enable novel computing and memory concepts. At the micro and nanoscale, synchronization mechanisms have the potential to be integrated with current nanofabrication capabilities and to enable scaling up to network sizes. The ability to control and manipulate such networks would enable to put in practice nonlinear dynamic theories that explain the behavior of synchronized networks.

The ability to couple and synchronize distributed nan-scale systems can lead to a new class of chip scale devices with a wide range of applications. However, micro-scale mechanical coupling and synchronization between cavities has been limited due to the non-directionality of acoustic radiation, anchor topologies, substrate leakage/material phonon losses, as well as restrictions of neighborhood in coupling. Major challenges with synchronized oscillators on the nanoscale are neighbourhood restriction and non-configurable coupling which limit the control, the footprint, and possible topologies of complex oscillator networks.

It would thus be advantageous to provide apparatus and methods according to the instant invention that solve or mitigate these problems. More particularly, benefits and advantages can be realized by a network of micro- and nano-dimensioned optomechanical resonant cavities that are coupled only through an optical radiation field as opposed to coupling through a structural contact or electrostatic interaction, and the external control of these networks for switching between coupled and individual oscillation states, paving a path towards synchronized micromechanical oscillator systems that are connected only via optical links.

An embodiment of the invention is directed to an externally synchronizable optomechanical oscillator (OMO) network. According to a non-limiting aspect, the synchronizable OMO network includes two or more dissimilar, autonomous (i.e., not externally controlled) OMOs each having by a different mechanical resonant frequency and each operable in a regenerative oscillation mode (i.e., a free-oscillation state), which are controllably, optically coupled only via an optical radiation field in the form of a regenerative oscillation mode-inducing signal in an optical, bi-directional medium coupling the two or more dissimilar, autonomous OMOs; and an OMO tuning component or apparatus that can be used to tune a single one of the plurality of OMOs operating in a regenerative oscillation mode to an optical resonant frequency of the single OMO, whereby the plurality of coupled, dissimilar, autonomous OMOs can thus be controllably synchronized. Autonomous, non-externally controlled OMOs means that the two or more coupled OMOs are coupled only through the optical radiation field as opposed to coupling through a structural contact or electrostatic interaction as described, for e.g. in Buks, E. & Roukes, M. Electrically tunable collective response in a coupled micromechanical array, Journal of Microelectromechanical Systems 11, 802-807 (2002) and Karabalin, R. B., Cross, M. C. & Roukes, M. L. Nonlinear dynamics and chaos in two coupled nanomechanical resonators, Physical Review B 79, 165309 (2009), the subject matter of which is incorporated herein by reference thereto. That the two or more coupled OMOs are controllably coupled and can be controllably synchronized means that the state of the two or more coupled OMOs can be externally switched between coupled, synchronized, and individual oscillation states. That the two or more coupled OMOs are optically coupled means that the mechanical displacement of one OMO will lead to a force on the other OMO only through the optical field. This force is responsible for the effective mechanical coupling between the two OMOs. According to various, non-limiting aspects, the embodied OMO network may be further characterized by some or all of the following features:

the plurality of dissimilar, autonomous OMOs have different dimensions;

the plurality of dissimilar, autonomous OMOs are silicon nitride ($Si_3N_4$);

wherein each of the OMOs is two, stacked disks;

wherein each of the OMOs is two, stacked rings;

the optical radiation field is a continuous-wave (CW) laser emission;

wherein the laser emission has a spectral output wavelength of 1550 nm;

the optical, bi-directional coupling medium is a free-space region (108 in FIG. 1c) immediately adjacent at least two adjacent OMOs that supports evanescent coupling of the radiation field between the at least two adjacent OMOs;

wherein the OMO network is disposed on a 10 cm×10 cm or smaller footprint chip;

wherein the at least two adjacent OMOs are separated by a distance d=400±20 nm;

wherein the optical, bi-directional coupling medium is an optical waveguide (109 in FIG. 1d) disposed adjacent at least two OMOs in a manner that supports evanescent coupling of the radiation field between the waveguide and the at least two OMOs;

wherein the OMO network comprises a span equal to or greater than 1,000 km;

wherein the OMO network comprises a span equal to or greater than 10,000 km;

wherein the OMO tuning component or apparatus is a laser;

wherein the plurality of dissimilar OMOs each includes a heating element;

wherein the heating element is chrome disposed on a surface of the OMOs.

An embodiment of the invention is directed to a method for externally controlling the state of an OMO in an OMO network between at least two of coupled, synchronized, and individual oscillation states. According to a non-limiting aspect, the method includes the steps of providing at least two dissimilar, autonomous OMOs consisting of cavity structures that support both tightly confined optical modes and long-living (high quality factor) mechanical modes; optically coupling the at least two dissimilar OMOs only via an optical radiation field by amplifying the mechanical modes of these cavities with a radiation field to a self-sustaining optomechanical oscillator state; and tuning the coupling between the at least two dissimilar OMOs to externally control the selection between coupled and individual oscillation states.

An embodiment of the invention is directed to a method for controllably synchronizing an optomechanical oscillator (OMO) network. According to a non-limiting aspect, the method includes the steps of providing at least two dissimilar, autonomous OMOs consisting of cavity structures that support both tightly confined optical modes and long-living (high quality factor) mechanical modes wherein each OMO is characterized by a different mechanical resonant frequency; establishing a bi-directional, optical communication link between the plurality of OMOs; optically coupling the at least two dissimilar OMOs only via an optical radiation field by amplifying the mechanical modes of these cavities with a radiation field to a self-sustaining optomechanical oscillator state; and tuning a single one of the plurality of OMOs to allow the radiation field to propagation in at least two of the OMOs.

The features described herein can be better understood with reference to the drawings described below. The drawings are not necessarily to scale, emphasis instead generally being placed upon illustrating the principles of the invention. In the drawings, like numerals are used to indicate like parts throughout the various views.

Figure 2:
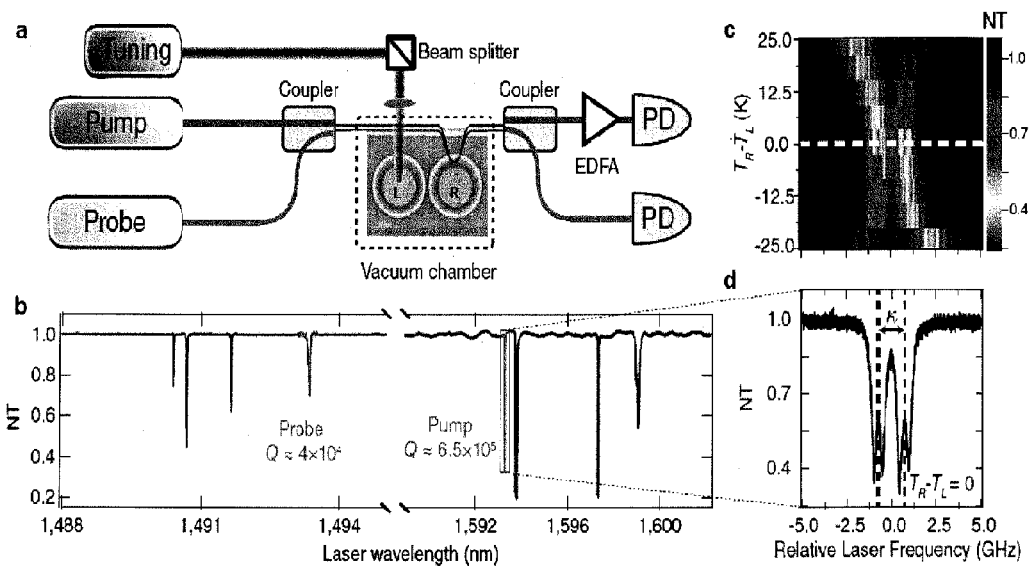
Figure 3:
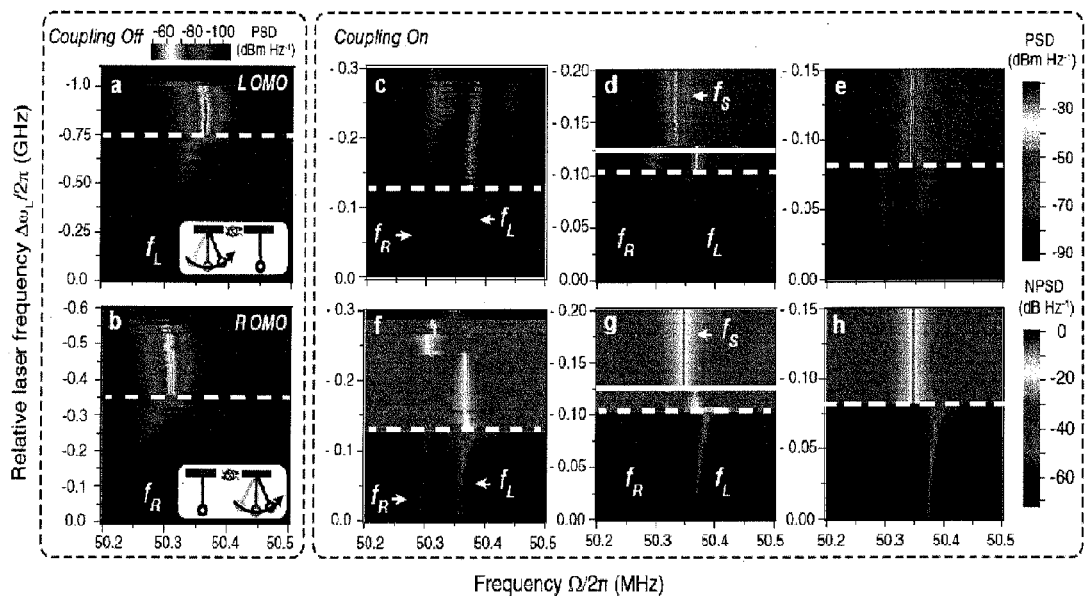
Figure 4:
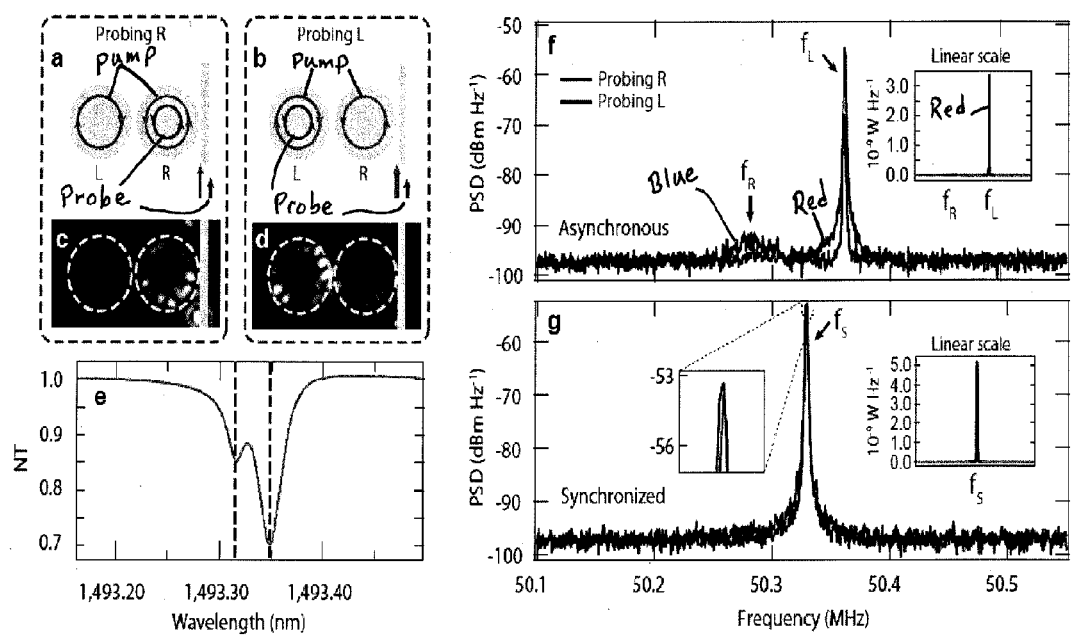

FIG. 1: Design of the optically coupled optomechanical oscillators (OMOs). (a) Schematic of the device illustrating the mechanical mode profile and the optical whispering gallery mode; (b) Scanning electron micrograph (SEM) image of the OMOs with chrome heating pads for optical tuning by top illumination.; (c,d) The symmetric (S) and anti-symmetric (AS) coupled optical supermodes. The deformation illustrates the mechanical mode that is excited by the optical field; (e) The dynamics of the coupled OMOs can be approximated by a lumped model for two optically coupled damped-driven nonlinear harmonic oscillators, according to exemplary aspects of the invention;

FIG. 2: Controlling the two-OMO system. (a) Schematic of the experimental setup. The pump and probe light are launched together into the cavities (112-1, 112-2 (FIG. 1b)) and are detected separately by photodiodes (PD). An erbium doped fiber amplifier (EDFA) is used to amplify the transmitted signal to increase the signal strength; (b) Transmission spectrum of the coupled cavities. NT: normalized transmission; (c) Anti-crossing of the optical mode as the relative temperature of the L OMO ($T_L$) and the R OMO ($T_R$) is changed through varying the tuning laser power. The tuning laser is focused on to the two OMOs respectively to obtain the negative and positive relative temperatures; (d) Transmission spectrum of the maximally coupled state indicated by the white horizontal line in (c). The right-hand and left-hand dips of the curve indicate the respective anti-symmetric and symmetric optical supermode, where κ is the optical coupling rate, according to demonstrative aspects of the invention;

FIG. 3: RF spectra of the OMOs and synchronization (a, b) RF power spectra of cavity L (a) and R (b) as a function of laser frequency when the coupling is turned off. The horizontal white lines indicate the onset of self-sustaining oscillation. PSD: power spectral density; (c) When the coupling is turned on, at an input power $P_{in}=(1.8\pm0.2)$ μW cavities L and R do not synchronize and oscillate close to their natural frequencies; (d) At $P_{in}=(11\pm1)$ μW synchronization occurs after the horizontal solid white line. The synchronized frequency appears between the two cavities natural frequencies but only appear after a region of unsynchronized oscillation (between the dashed and solid white lines); (e) The system oscillate directly in a synchronized state at input optical power $P_{in}=(14\pm1)$ μW; (f,g,h) Corresponding numerical simulations for the OMO system based on the lumped harmonic oscillator model illustrated in FIG. 1d. NPSD: normalized power spectral density, according to demonstrative aspects of the invention;

FIG. 4: Pump-probe measurement of the individual OMOs oscillation when coupled. The input pump power is $P_{in}=(11\pm1)$ μW as in FIG. 3d. (a,b) Schematic of the pump-probe measurement principle. While the pump laser (green) is symmetrically shared between the two OMOs, the probe laser (blue for probing R and red for L) can measure each cavity selectively; (c,d) The uneven probe intensity distribution of the cavities (112-1, 1 (FIG. 1b)), observed by an infrared CCD camera when the pump laser is off; (e) Normalized transmission (NT) spectrum for the probe resonances, which correspond to the probe (orange) resonances shown in FIG. 2b. The left (red) and right (blue) dashed lines correspond to the probe wavelength region for probing the L and R OMO, as illustrated in (a,b); (f) The red (blue) curve is the L (R) cavity probe transmission RF spectrum, when the pump is in the asynchronous region $-0.13<\Delta\omega_L/2\pi<-0.10$ GHz shown in FIG. 3d; a strong peak at $f_R$ is observed but with very different amplitude for two probing conditions. The right inset figures show the same curves in linear scale, emphasizing the large difference between the blue and red curves; (g) Same curves shown in (f) but with the pump laser in the synchronous region $\Delta\omega_L/2\pi<-0.13$ GHz of FIG. 3d. Here both cavities have similar amplitude at $f_s$, which can be clearly noticed in the linear scale inset, according to demonstrative aspects of the invention.

The optomechanical oscillator (OMO) network(s) described herein includes two or more dissimilar optomechanical resonators (OMRs)/optomechanical oscillators (OMOs). The OMOs are dissimilar in that they are fabricated with slightly different dimensions (i.e. slightly different mechanical frequencies), as described in greater detail below. The OMRs/OMOs do not form a part of the invention per se; the interested reader is directed to copending international application PCT/US11/36223 for a description of exemplary OMRs/OMOs, the subject matter of which is incorporated by reference herein to the fullest extent allowed by applicable laws and rules.

As will be more fully described below, each OMR/OMO device is an optomechanical resonator below a certain threshold parameter, which evolves into a self-sustaining optomechanical oscillator above a certain threshold parameter. Hereinafter, each device will be referred to as an optomechanical oscillator (OMO) regardless of its operational damping characteristics.

Optomechanical oscillators (OMOs) consist of cavity structures that support both tightly confined optical modes and long-living (high quality factor) mechanical modes. These modes can be strongly coupled: the cavity optical field leads to optical forces acting on the mechanical structure; mechanical displacements due to this force in turn affect the cavity optical field. Amplification or cooling of the mechanical modes of these cavities can be achieved by feeding these cavities with a continuous-wave (CW) laser. The mechanical vibration (driven by thermal Brownian motion) induces fluctuations of the cavity length, which translates into fluctuations of the optical resonant frequency; for a fixed-frequency driving laser this implies that the optical energy stored in the cavity also oscillates. Due to a finite cavity optical lifetime, the optical field does not respond instantaneously to the mechanical motion, but instead oscillates with a slight phase lag. As the force that the optical field exerts on the mechanical mode is proportional to the stored optical energy, it will also experience such delay. Consequently, the optical force will have one component that is in phase with the mechanical displacement, and another component that is 90 degrees out of phase. When the laser is blue (red) detuned with respect to the optical mode frequency, the optical force component that is in phase with the mechanical vibration induces an optical spring effect that increases (reduces) the mechanical frequency, thus stiffening (softening) the mechanical spring. The out of phase component will decrease (increase) the effective mechanical damping, thus amplifying (cooling) the mechanical oscillation. Above a certain threshold laser power this optomechanical amplification overcomes the intrinsic mechanical damping; the device evolves from an optomechanical resonator to a self-sustaining optomechanical oscillator (OMO). The laser signal fraction that is transmitted, or reflected, from the optomechanical cavity becomes deeply modulated at the mechanical frequency of the oscillator.

We recently reported that a pair of OMOs could synchronize if they are optically coupled as opposed to being mechanically coupled (see Manipatruni, S., Wiederhecker, G. & Lipson, M. Long-range synchronization of optomechanical structures. In Quantum Electronics and Laser Science Conference, QWI1 (Optical Society of America, 2011), the subject matter of which is incorporated by reference herein to the fullest extent allowed by applicable laws and rules). We have demonstrated the synchronization of two optically coupled OMOs [right (R) and left (L)] that are fabricated with slightly different dimensions (i.e. slightly different mechanical frequencies). Optical coupling means that the mechanical displacement of one OMO will lead to a force on the other OMO through the optical field. This force is responsible for the effective mechanical coupling between the two OMOs. As the OMOs are pumped by a blue-detuned CW laser into self-sustaining oscillations, the R (L) OMO not only experiences the oscillation at its natural frequency, but also a modulated optical force at the L (R) OMO's mechanical frequency. As the coupling between the two oscillators is increased, each OMO is eventually forced to oscillate at an intermediate frequency between their natural frequencies (R and L); that is, the onset of synchronization. We observe both the individual free-running and synchronized oscillation dynamics by switching on and off the purely optical coupling between two OMOs.

Each individual OMO (103-1, 103-2) shown in FIGS. 1*a,b* consists of two suspended, vertically stacked $Si_3N_4$ disks. As illustrated in FIG. 1*a*, the optical and mechanical modes of such a cavity are localized around its free-standing edge. The disks are fabricated using standard electron-beam lithography followed by dry and wet etching steps (described in further detail below). The two disks are 40 μm in diameter and 210 nm in thickness, while the air gap between them is 190 nm wide. Such a small gap and the relative low refractive index of $Si_3N_4$ (n≈2.0) induce a strong optical coupling between the top and bottom disks. The resonant frequency of the optical modes of the stacked disks depend strongly on their separation; therefore any mechanical vibration that modulates the vertical gap width also modulates the optical resonant frequency. A measure for the efficiency of this process is the optomechanical coupling, defined as $g_{om}=\partial\omega/\partial x$, where ω is the optical frequency and x is the mechanical mode amplitude. The exemplary device exhibits a large optomechanical coupling, calculated to be $g_{om}/2\pi=49$ GHz/nm. The mechanical mode that couples most strongly to the optical field is also illustrated by the deformation of the disk's edge in FIGS. 1*a,c*, which has a natural frequency of $\Omega_m/2\pi\approx50.5$ MHz. Variations in the fabrication process lead to different mechanical frequencies and the two cavities are not identical, and without the optical coupling they oscillate at different mechanical frequencies.

The exemplary network of two OMOs illustrated in FIGS. 1*a,b* are separated by a distance of dg=(400±20) nm, minimizing direct mechanical coupling. This gap results in evanescent optical coupling between the OMOs when their optical resonant frequencies are close. The optical coupling leads to two optical supermodes (as used herein, a 'supermode' is an optical mode shared by more than one cavity) spatially spanning both OMOs: a symmetric, lower frequency mode $b_+(t)$ (FIG. 1*c*) and an anti-symmetric higher frequency mode $b_-(t)$ (FIG. 1*d*). Their eigenfrequencies are given by $\omega_\pm=\omega_{bar}\pm\kappa/2$, where $\omega_{bar}=(\omega_L+\omega_R)/2$ and $\omega_L$ ($\omega_R$) is the uncoupled optical resonant frequency of the L (R) OMO and κ is the optical coupling rate: a reflection of the distance between the two cavities. The mechanical modes of each cavity can be approximated by a lumped model consisting of two damped harmonic oscillators, which are driven by the optical supermode forces, $$\ddot{x}_j+\Gamma_j\dot{x}_j+\Omega_j^2 x_j = F_{opt}^{(j)}(x_R,x_L)/m_{eff}^{(j)}, \text{ for } j,k=L,R \qquad (1)$$

where $x_j$, $\Omega_j$, $\Gamma_j$, $m^{(j)}_{eff}$ represent the mechanical displacement, mechanical resonant frequency, dissipation rate, and effective motional mass of each mechanical degree of freedom. The optical force is proportional to the optical energy stored in the coupled optical modes, which depend both on $x_R$ and $x_L$, i.e., $F^{(j)}_{opt}(x_R, x_L)$ is proportional to $|b_\pm(x_R, x_L)|^2$. Therefore the optical field not only drives but also mechanically couples each OMO. The nonlinear nature of this driving and coupling force form the basis for the onset of synchronization. In a first order linear approximation when the two OMOs are evenly coupled ($\omega_L=\omega_R$), the effective mechanical coupling force between the two oscillators is given by $F^{(i)}_{coup}=-k_I x_j + k_Q \dot{x}'_j$ where $k_I$ and $k_Q$ are the position and velocity coupling coefficients. These coupling coefficients are determined by both the input optical power $P_{in}$ and laser-cavity detuning Δ as $k_I$ proportional to $P_{in}\Delta/((\gamma/2)^2+\Delta^2)^2$ and $k_Q$ proportional to $P_{in}(\gamma/2)\Delta/((\gamma/2)^2+\Delta^2)^3$ in the unresolved side band limit (optical damping rate $\gamma\ll\Omega_j$) as in our system. Therefore, by varying Δ and $P_{in}$, hence the effective mechanical coupling strength, synchronization of the two OMOs can be captured.

The exemplary two-OMO system can be reconfigured to exhibit either coupled or single OMO dynamics by controlling the spatial distribution of the optical field between the two oscillators. While the distance between the two OMOs is fixed (i.e. fixed κ), their optical coupling can be turned off (on) through increasing (decreasing) the optical frequency mismatch $\delta=\omega_R-\omega_L$ between them. For large optical frequency mismatch among the two OMOs (δ≫κ), the supermodes reduce to the uncoupled optical modes of the individual OMO, $(b_+, b_-)\to(a_L, a_R)$. This can be readily seen from the expression of the optical supermodes amplitudes, which are given by linear combinations of the uncoupled modes of the left $a_L(t)$ and right $a_R(t)$ cavities: $b\pm(t)=a_L(t)-a_R(t)i\kappa/(\delta\pm(\delta^2-\kappa^2)^{1/2}$. The OMO was tuned using thermo-optic effect, for which the optical frequency dependence on temperature can be approximated as $\omega_j(T_j)=\omega^{(j)}_0-g_{th}T_j$ for j=L, R, where $\omega^{(j)}_0$ is the intrinsic optical frequency and $g_{th}$ is the thermal-optic tuning efficiency. The thermo-optic tuning was accomplished by focusing an out-of-plane laser beam (near-IR laser (JDS SWS16101) amplified by a high power EDFA (Keopsys KPS-CUS-BT-C-35-PB-111-FA-FA) that can provide a maximum power of 2 W) with wavelength 1550 nm on either OMO (FIG. 2a). Approximately 50 mW of laser power was needed to achieve the desired tuning range. In order to increase the laser absorption, a 200 nm layer of chrome was deposited in the center of both OMOs (FIGS. 2a,b). As heat is dissipated in the chrome pads, the cavity temperature increases and red-shifts the optical resonance of the cavity through thermo-optic effect. A signature that the optical frequencies of both OMOs are matched is given by the almost symmetric resonance dips observed in the optical transmission spectrum (FIGS. 2b, 2d), which also indicates maximum optical coupling between the cavity optical modes. The optical modes can be continuously tuned by changing the relative cavity temperature as in FIG. 2c. At $\Delta T=0$, the maximum optical coupling was observed, whereas for $\Delta T=\pm 25K$, the relative frequency difference was large ($\delta \gg \kappa$) and the optical mode in eq. (1) does not couple the two OMOs; rather, they follow the usual single-cavity optomechanical dynamics.

We characterized the individual dynamics of the two OMOs by switching their optical coupling off. This was achieved through increasing the heating laser power such that the temperature difference corresponds to the extremities in FIG. 2c. Each cavity was individually excited with a CW laser through a tapered optical fiber. As the laser frequency was tuned (from a higher to a lower frequency) into the optical resonance, the radio-frequency (RF) spectrum of the transmitted laser signal was detected by a photodiode (PD) and recorded using a RF spectrum analyzer (RSA). The results revealing the single-cavity optomechanical dynamics are shown in FIGS. 3a,b. The mechanical modes have natural mechanical frequencies of $(f_L, f_R)=(\Omega_L, \Omega_R)/2\pi=(50.283; 50.219)$ MHz, and intrinsic quality factors of $(Q^{(L)}_m, Q^{(R)}_m)=(3.4\pm 0.3, 2.3\pm 0.2)\times 10^3$. Due to the increased optomechanical back-action and intracavity optical power the OMOs' frequencies are increased (optical spring effect) and their amplitudes grown as the laser is tuned into the optical resonance. Above a specific laser-cavity detuning, indicated by the horizontal white dashed lines on FIGS. 3a,b, the intrinsic mechanical losses are completely suppressed by the optomechanical amplification. At this point the optomechanical resonator starts self-sustaining oscillations and becomes an OMO characterized by sudden linewidth narrowing and oscillation amplitude growth. As the laser frequency sweeps away from the optical resonance it eventually reaches the point of maximum optical power coupled to the cavity; further sweeping can only reduce the optical power inside the cavity and the oscillation vanishes. It is clear from FIGS. 3a,b that each cavity has only one mechanical mode in the frequency range of interest. Due to the slight difference in geometry, these frequencies differ by $\Delta f=f_L-f_R=(70.0\pm 0.5)$ kHz.

The onset of spontaneous synchronization is demonstrated by sweeping the CW pump laser across the optical resonance, similarly to the single-cavity measurements discussed above; only now the optical coupling is switched on for coupled dynamics. Using the heating laser, we tuned the optical coupling to its maximum value, indicated by the dashed-white line $(T_R-T_L=0)$ in FIG. 2c. The laser frequency sweeping is performed at various optical power levels corresponding to different effective mechanical coupling strengths. The optical power ranges from slightly above the estimated oscillation threshold (i.e., weaker mechanical coupling for the L and R OMOs, $P^{(L,R)}_{th}\approx(640, 880)$ nW, up to several times their threshold power (i.e., stronger mechanical coupling). At a relatively low input power, $P_{in}=(1.8\pm 0.2)$ μW, the mechanical peaks at $f_R$ and $f_L$ are simultaneously observed on the RF spectrum shown in FIG. 3c, below the dashed-white line. When the laser frequency is closer to the optical resonant frequency, more energy is available and the L OMO starts self-sustaining oscillation. Since cavity R has a higher oscillation threshold, due to its lower mechanical quality factor, it requires more optical power and only oscillates at a redder detuning. It can be noticed from FIG. 3c that both OMOs oscillate close to their natural frequency. Therefore they exhibit asynchronous oscillations at this lowest power level. At a higher input optical power level of $P_{in}=(11\pm 1)$ μW, the first oscillation takes place at $\Delta\omega_L/2\pi\approx 0.10$ GHz, and similarly to the case shown in FIG. 3c, the L OMO oscillates first. However, as the laser frequency further moves into the optical resonance, there is enough energy for both OMOs to start self-sustaining oscillations; the two OMOs spontaneously oscillate in unison at an intermediate frequency of $f_S=\Omega_S/2\pi=50.37$ MHz due to the increased effective mechanical coupling, which is a clear sign of synchronization. At this time, the output optical RF power is increased by more than 5 dB in comparison with the L OMO oscillating only case, showing that the two OMOs are phase-locked. At an even higher optical input power, $P_{in}=(14\pm 1)$ μW, the OMOs do not oscillate individually; rather, they go directly into synchronized oscillations above the white-dashed line in FIG. 3e. We confirmed that the OMOs are synchronized by performing numerical simulations corresponding to each of the power levels that were tested. The simulated spectra in FIGS. 3f,g,h exhibit all the essential features observed and show good agreement with the measured spectra. It also confirms under which conditions the two OMOs are indeed oscillating.

To experimentally verify that both structures were oscillating at the synchronized frequency, we probed the mechanical oscillation of each cavity individually. This demonstrated that the single oscillation peaks observed in FIGS. 3d,e are not caused by one OMO resonantly driving the other, and also verifies that amplitude death of one of the OMOs does not occur, which is a known phenomenon in coupled nonlinear oscillators. The transmitted pump laser signal provides only global information of the coupled OMO system, it does not distinguish the individual contribution from each OMO to the synchronized signal. To overcome this, a weak CW probe laser was used, as shown in the setup in FIG. 2a to excite an optical resonant mode that is not strongly coupled between the two OMOs. The scheme illustrated in FIGS. 4a,b allowed the selective probing of the oscillations of the L or R OMO. FIGS. 4c,d show the uneven light intensity distribution that were directly observed by capturing the scattered light with an infrared camera. The asymmetric splitting is also evident on the probe transmission shown in FIG. 4e. While these probed optical modes exhibit a low optical quality factor $(Q_{opt}\approx 4E4)$ that minimizes probe-induced perturbations to the mechanical oscillations, the pump laser power and sweep is identical to that used and shown in FIG. 3d. When the L OMO is probed, and the pump detuning range is between the dashed and solid lines in FIG. 3d, the probe RF spectrum shows a strong peak at $f_L$, which is shown in the red curve in FIG. 4f. When the R OMO is probed, a peak also appears at this frequency, but it is 13 dB weaker as shown in the blue curve in FIG. 4f; a weak peak at $f_R$ can also be noticed on the blue curve, indicating small amplitude oscillations of the R OMO. These results confirm that the oscillation state is very asynchronous in this detuning range with the L OMO oscillating at much larger amplitude. When the pump laser detuning is above the horizontal solid line in FIG. 3d, there is only a single RF peak at the synchronized frequency $f_S$ when probing either OMO (FIG. 4g); moreover, they differ in amplitude by less than 0.5 dB. This shows that both cavities are indeed oscillating with similar strength at the synchronized frequency.

The embodied invention demonstrates synchronization between two optomechanical oscillators coupled only through the optical radiation field. The ability to control the coupling strength may be advantageous for realizing oscillator networks in which the oscillators can be addressed individually. Furthermore, established and future micro-photonics techniques such as electro-optic and thermo-optic techniques can now be extended to switch, filter and phase shift the coupling of these oscillators. Here we demonstrated coupling the near field between.

To achieve long range (e.g., 1,000 km; 10,000 km) coupling of optomechanical oscillators, optical waveguides and optical fibers can be used to enable oscillator networks spread over large areas limited only by optical waveguide/fiber losses. Optically mediated mechanical coupling will also remove the restrictions of neighborhood while creating 1D/2D/3D mechanical oscillator arrays. Using long range, directional and controllable mechanical coupling, synchronized optomechanical systems may enable a new class of devices in sensing, signal processing and on-chip non-linear dynamical systems.

Additional Discussion

While a discussion of a detailed model of the coupled optomechanical system is beyond the scope of this disclosure, a simplified version follows that may be appreciated by the interested reader. The optical mode amplitudes are approximated by two coupled harmonic oscillator equations given by $$a'_j = i\Delta_j a_j - (\gamma/2)a_j + i\kappa a_k + (\gamma_e)^{1/2} s_j, \quad (2)$$

for j, k=L, R, j≠k, where $\omega - \omega_j(x_j, T_j)$ is the laser-cavity frequency detuning, $\omega$ is the optical frequency of the CW driving laser, $\omega_j(x_j, T_j)$ is the optical frequency of the each uncoupled optical mode ($a_{R,L}$), which depends both on each cavity temperature ($T_{R,L}$) and mechanical mode amplitude ($x_{R,L}$). The optical dissipation rate is given by $\gamma$ and is assumed to be the same for both cavities; the coupling rate $\kappa$ measures the evanescent field interaction of the two modes and couples the two optical cavities. The CW laser drive $(\gamma_e)^{1/2} s_j$, which depends on the cavity coupling to the tapered fiber $\gamma_e$, only drives the $a_R$ mode ($(\gamma_e)^{1/2} s_j = 0$), resembling the experimental configuration shown in FIG. 2a, where the tapered fiber excites only the rightmost cavity. Equ. (2) can be diagonalized to yield the coupled optical modes (super-modes) described above.

Device Fabrication

Two 210 nm thick stoichiometric $Si_3N_4$ films were deposited using low-pressure chemical vapor deposition (LPCVD). A 190 nm $SiO_2$ layer was deposited by plasma-enhanced chemical vapor deposition (PECVD). The underlying substrate is a 4 μm $SiO_2$ formed by thermal oxidation of a silicon wafer. The OMOs were defined by electron beam lithography, which was then patterned by reactive ion etching. The heater pads were subsequently defined by photolithography lift-off process. After defining the circular pads with lift-off resist, 200 nm of chrome was deposited on the device using electron beam evaporation and the residual chrome was liftoff afterwards. In order to release the structure, the device was immersed in buffered hydrofluoric acid (6:1) for an isotropic etch of the $SiO_2$ in between the disks and the substrate layer. The device was then dried with a critical point dryer to avoid stiction between the two $Si_3N_4$ disks.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. No language in the specification should be construed as indicating any non-claimed element as essential to the practice of the invention.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

We claim:

1. A synchronizable optomechanical oscillator (OMO) network, comprising:
   a plurality of dissimilar OMOs each characterized by a different mechanical resonant frequency and operable in a regenerative oscillation mode, which are coupled only via an optical radiation field; and
   an OMO tuner adapted to tune a single one of the plurality of OMOs in a regenerative oscillation mode to an optical resonant frequency of the single OMO, whereby the plurality of coupled, dissimilar OMOs can be controllably synchronized.

2. The OMO network of claim 1, wherein an optical, bi-directional coupling medium is a free-space region immediately adjacent at least two adjacent OMOs that supports evanescent coupling between the at least two adjacent OMOs.

3. The OMO network of claim 2, wherein the at least two adjacent OMOs are separated by a distance d=400+ or −20 nm.

4. The OMO network of claim 1, wherein an optical, bi-directional coupling medium is an optical waveguide disposed adjacent at least two OMOs in a manner that supports evanescent coupling between the optical waveguide and the at least two OMOs.

5. The OMO network of claim 1, wherein the OMO tuner is a laser.

6. The OMO network of claim 5, wherein the laser has a spectral output wavelength of 1550 nm.

7. The OMO network of claim 5, wherein the plurality of dissimilar OMOs each includes a heating element.

8. The OMO network of claim 5, wherein the heating element comprises chrome.

9. The OMO network of claim 1, wherein each of the plurality of dissimilar OMOs are two, stacked Si3N4 disks.

10. The OMO network of claim 1, wherein each of the plurality of dissimilar OMOs are two, stacked SiNx rings.

11. A method for controllably synchronizing an optomechanical oscillator (OMO) network comprising a plurality of dissimilar OMOs, comprising the steps of:
- providing a plurality of dissimilar OMOs each characterized by a different mechanical resonant frequency and operable in a regenerative oscillation mode;
- establishing a bi-directional, optical communication link between the plurality of OMOs;
- optically exciting the plurality of OMOs to respective regenerative oscillation modes; and
- tuning a single one of the plurality of OMOs to allow an optical field propagation in at least two of the OMOs.

12. A method for externally controlling the state of an optomechanical oscillator (OMO) in an OMO network, comprising:
- providing at least two dissimilar OMOs;
- coupling the at least two dissimilar OMOs, wherein the coupling consists of an optical radiation field; and
- tuning the coupling between the at least two dissimilar OMOs to externally control the selection between coupled and individual oscillation states.

* * * * *